United States Patent
Iida et al.

(10) Patent No.: US 6,843,847 B1
(45) Date of Patent: Jan. 18, 2005

(54) SILICON SINGLE CRYSTAL WAFER AND PRODUCTION METHOD THEREOF AND SOI WAFER

(75) Inventors: Makoto Iida, Gunma (JP); Masanori Kimura, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 50 days.

(21) Appl. No.: 09/869,912

(22) PCT Filed: Nov. 7, 2000

(86) PCT No.: PCT/JP00/07809

§ 371 (c)(1),
(2), (4) Date: Jul. 9, 2001

(87) PCT Pub. No.: WO01/36719

PCT Pub. Date: May 25, 2001

(30) Foreign Application Priority Data

Nov. 12, 1999 (JP) .......................................... 11-322487

(51) Int. Cl.[7] ............................................... C30B 15/20
(52) U.S. Cl. ............................. 117/13; 117/14; 117/19; 117/932
(58) Field of Search ............................. 117/13, 14, 19, 117/932

(56) References Cited

U.S. PATENT DOCUMENTS 6,139,625 A * 10/2000 Tamatsuka et al. ............. 117/19
6,162,708 A * 12/2000 Tamatsuka et al. ........... 438/503

FOREIGN PATENT DOCUMENTS

| EP | 942078 A1 | * 9/1999 |
|----|-----------|----------|
| EP | 0969505 A2 | 1/2000 |
| JP | A 10-50715 | 2/1998 |
| JP | A 11-260677 | 9/1999 |
| JP | A 11-307747 | 11/1999 |
| JP | A 2000-7486 | 1/2000 |

OTHER PUBLICATIONS

M. Iida et al., "Effects of Light Element Impurities on The Formation of Grown–In Defects Free Region of Czochralski Silicon Single Crystal", Electrochemical Society Proceedings, vol. 99–1, pp. 499–510.

Wataru Ohashi et al., "Chisso Tenka CZ–Si Kesshou Kekkan Seigyo (No. 1)", Mar. 28, 1999, Dai 46 kai, Oyou Butsurigaku Kankei Rengou Kouenkai Kouen Yokoshu (Ouyou Butsur Gakkai, Tokyo) p. 468, middle paragraph separate vol. 1.

* cited by examiner

Primary Examiner—Robert Kunemund
(74) Attorney, Agent, or Firm—Oliff & Berridge, PLC

(57) ABSTRACT

A silicon single crystal wafer grown by the CZ method, which is doped with nitrogen and has an N-region for the entire plane and an interstitial oxygen concentration of 8 ppma or less, or which is doped with nitrogen and has an interstitial oxygen concentration of 8 ppma or less, and in which at least void type defects and dislocation clusters are eliminated from the entire plane, and a method for producing the same. Thus, there are provided a defect-free silicon single crystal wafer having an N-region for the entire plane, in which void type defects and dislocation clusters are eliminated, produced by the CZ method under readily controllable stable production conditions with a wide controllable range, and a method producing the same.

21 Claims, 1 Drawing Sheet

SILICON SINGLE CRYSTAL WAFER AND PRODUCTION METHOD THEREOF AND SOI WAFER

TECHNICAL FIELD

The present invention relates to a defect-free silicon single crystal wafer doped with nitrogen and having substantially no crystal defects and a method for producing the same.

BACKGROUND ART

In recent years, in connection with the use of finer devices accompanying the use of higher integration degree of semiconductor circuits such as DRAM, demand for quality of silicon single crystals produced by the Czochralski method (it is also abbreviated as "CZ method" hereinafter) from which substrates therefor are produced is becoming higher. In particular, since there are defects generated during the crystal growth, which are called grown-in defects such as FPD, LSTD and COP, and they degrade oxide dielectric breakdown voltage and device characteristics, reduction of density and size of these defects is considered important.

Prior to explanation of those defects, there will be given first general knowledge of factors determining densities of defects introduced into silicon single crystals, a vacancy type point defect called vacancy (also abbreviated as V hereinafter), and an interstitial type silicon point defect called interstitial silicon (interstitial-Si, also abbreviated as I hereinafter).

In a silicon single crystal, a V-region means a region containing many vacancies, i.e., depressions, holes and so forth generated due to shortage of silicon atoms, and an I-region means a region containing many dislocations and aggregations of excessive silicon atoms generated due to excessive amount of silicon atoms. And between the V-region and the I-region, there should be a neutral region (also abbreviated as N-region hereinafter) with no (or little) shortage or no (or little) surplus of the atoms. Further, it has become clear that the aforementioned grown-in defects (FPD, LSTD, COP etc.) should be generated strictly only with supersaturated V or I, and they would not be present as defects even though there is little unevenness of atoms so long as V or I is not saturated.

It is known that densities of these two kinds of point defects are determined by the relationship between the crystal pulling rate (growing rate) F, and the temperature gradient G in the vicinity of the solid-liquid interface in the crystal in the CZ method. It has also been confirmed that defects distributed in a ring shape called OSF (Oxidation Induced Stacking Fault) are present in the N-region between the V-region and the I-region. Since OSFs are generated in a shape of concentric circle observed in a wafer surface when the wafer is sliced from a single crystal, there is used a term of OSF ring.

Those defects generated during the crystal growth are classified as follows. For example, when the growth rate is relatively high, i.e., around 0.6 mm/min or higher, grown-in defects considered to be originated from voids, i.e., aggregations of vacancy-type point defects, such as FPD, LSTD and COP, are distributed at a high density over the entire cross-section of the crystal along the radial direction, and a region containing such defects is called V-rich region (region in which supersaturated vacancies form void defects). When the growth rate is 0.6 mm/min or lower, with the decrease of the growth rate, the aforementioned OSF ring is initially generated at the circumferential part of the crystal, and L/D (large dislocations, abbreviation of interstitial dislocation loops, which include LSEPD, LFPD and so forth), which are considered to be originated from dislocation loops, are present outside the ring at a low density. A region containing such defects is called I-rich region (region in which supersaturated interstitial silicons form dislocation loop defects). When the growth rate is further lowered to around 0.4 mm/min or lower, the OSF ring shrinks and disappears at the center of wafer, and thus the entire plane becomes the I-rich region.

Recently, there has been discovered a region called N-region between the V-rich region and the I-rich region, and outside the OSF ring, in which neither of the vacancy-originated FPD, LSTD and COP, the dislocation loop-originated LSEPD and LFPD and OSF are present. This region exists outside the OSF ring, and shows substantially no oxygen precipitation when it is subjected to a heat treatment for oxygen precipitation and examined by X-ray analysis or the like as for the precipitation contrast. This region is present at rather I-rich side, in which the defects are not so rich as to form LSEPD and LFPD.

Presence of the N-region was also confirmed inside the OSF ring, in which neither of vacancy-originated void type defects, dislocation loop-originated defects and OSFs were present.

Because these N-regions are formed obliquely with respect to the growing axis when the growth rate is lowered in a conventional growing method, it exists as only a part of the wafer plane.

As for this N-region, according to the Voronkov's theory (V. V. Voronkov, Journal of Crystal Growth, 59 (1982) 625–643), it was proposed that a parameter of F/G, which is a ratio of the pulling rate (F) and the crystal solid-liquid interface temperature gradient (G) along the growing axis, determined the total density of the point defects. In view of this, because the pulling rate should be constant in a plane, for example, a crystal having a V-rich region at the center, I-rich region at the periphery, and N-region between them is inevitably obtained at a certain pulling rate due to distribution of G in the plane.

Therefore, improvement of such distribution of G has recently been attempted, and it has become possible to produce a crystal having the N-region spreading over an entire transverse plane of the crystal, which region could previously exist only obliquely, for example, at a certain pulling rate when the crystal is pulled with a gradually decreasing pulling rate F. Further, such an N-region spreading over an entire transverse plane can be made larger to some extent along the longitudinal direction of the crystal by pulling the crystal at a pulling rate maintained at the value at which the N-region transversely spreads. Furthermore, it has also become possible to make the N-region spreading over the entire transverse plane somewhat larger along the growing direction by controlling the pulling rate considering the variation of G with the crystal growth to compensate it, so that the F/G should strictly be maintained constant.

That is, by pulling a CZ crystal with controlling F/G so that it should have the N-region for the entire plane, it has become possible to reduce the void type defects and dislocation clusters. However, there remains a problem that a margin for the control width of F/G is very narrow.

On the other hand, it is conventionally known that a silicon single crystal doped with nitrogen can reduce the defects in FZ silicon, and this method is also applied to the CZ method by utilizing the unique oxygen precipitation characteristics and so forth of nitrogen.

Therefore, in Japanese Patent Application No. 11-022919, the inventors of the present invention proposed production conditions for improving yield and productivity of wafers having the N-region for the entire plane utilizing the fact that the N-region is enlarged by doping nitrogen.

However, although the N-region containing no void type defects and no dislocation clusters, which are observed in the I-rich region, is surely enlarged to a significant degree with nitrogen doping, most of it consists of an N-region containing an OSF region, and enlargement degree of N-region containing no OSF region, which is practically usable as defect-free wafers, is relatively small.

Further, there is also a problem that the OSF region obtained with nitrogen doping shows an OSF nucleus density higher by several times compared with an OSF region obtained without nitrogen doping, and dislocation loops generated due to such OSF nuclei are present and adversely affect devices.

DISCLOSURE OF THE INVENTION

Therefore, the present invention was accomplished in view of the aforementioned problems, and its object is to search for crystal pulling conditions for inactivating the OSF region, because, if a crystal is pulled with nitrogen doping so that it should have an N-region containing an OSF region, it is necessary to inactivate the OSF region in order to use the crystal as defect-free wafers, and to produce silicon single crystal wafers having an N-region for the entire plane, in which void type defects and dislocation clusters are eliminated, by the CZ method under readily controllable stable production conditions with a wide controllable range while maintaining high productivity and high yield of the wafers.

The present invention was accomplished in order to achieve the aforementioned object, and provides a silicon single crystal wafer grown by the Czochralski method, which is doped with nitrogen, and has an N-region for the entire plane and an interstitial oxygen concentration of 8 ppma or less.

If the interstitial oxygen concentration is 8 ppma or less as defined above, even though the N-region contains an OSF region, OSFs are not generated from the OSF region, and dislocation loops are not generated by the Secco etching. Thus, the wafer can be a substantially defect-free wafer that does not contain defects adversely affecting device characteristics.

The silicon single crystal wafer of the present invention is also a silicon single crystal wafer grown by the Czochralski method, which is doped with nitrogen, and has an interstitial oxygen concentration of 8 ppma or less, and in which at least void type defects and dislocation clusters are eliminated from the entire plane.

Because at least void type defects and dislocation clusters are eliminated from the entire plane of the crystal and the interstitial oxygen concentration is 8 ppma or less, the above wafer can be a substantially defect-free wafer like the aforementioned wafer.

In these wafers, the interstitial oxygen concentration can be adjusted to 5 ppma or less.

If the oxygen concentration is 5 ppma or less as defined above, the wafers can be substantially completely defect-free wafers. Therefore, if oxide dielectric breakdown voltage (TZDB, time zero dielectric breakdown) of these wafers is measured, a good chip yield of substantially 100% can be obtained.

Further, in these wafers, the concentration of the doped nitrogen can be $1 \times 10^{14}$ number/cm$^3$ or more.

If the nitrogen concentration is $1 \times 10^{14}$ number/cm$^3$ or more as defined above, oxygen precipitation can be obtained in a bulk portion to a certain extent by the oxygen precipitation promoting effect of nitrogen, and therefore IG (Intrinsic Gettering) effect can be expected in spite of the low oxygen concentration.

Furthermore, in the silicon single crystal wafers of the present invention, the concentration of the doped nitrogen is preferably $5 \times 10^{14}$ number/cm$^3$ or more.

If the nitrogen concentration is $5 \times 10^{14}$ number/cm$^3$ or more as defined above, the oxygen precipitation promoting effect will be further improved, and the IG effect become higher.

Further, in the present invention, one of the main surfaces of either of the aforementioned silicon single crystal wafers is preferably subjected to an EG treatment.

The IG effect can be expected at a certain level by increasing the nitrogen concentration as described above. However, there may be a case that such a level is insufficient, and therefore the main surface opposite to the other main surface on which devices are fabricated is preferably subjected to an EG (Extrinsic Gettering) treatment such as PBS (Polyback Seal (registered trademark) and BSD (backside damage).

The present invention further provides an SOI wafer, which uses either of the aforementioned silicon single crystal wafers as an SOI layer.

If such a substantially defect-free wafer as described above is used as an SOI (Silicon On Insulator) layer, insulation failures due to penetration of void type defects through the SOI layer are not generated, and since it is a CZ wafer, it can be produced with a larger diameter and can be obtained at a relatively low cost. Therefore, the reduction of production cost of high quality SOI wafers can be contemplated.

The present invention also provides a method for producing a silicon single crystal wafer, wherein the wafer is produced from a single crystal pulled under such conditions that the crystal should have an N-region for the entire plane and interstitial oxygen concentration should become 8 ppma or less when the crystal is grown by the Czochralski method with nitrogen doping.

As described above, a substantially defect-free wafer can be obtained from a crystal pulled so that the interstitial oxygen concentration should become 8 ppma or less and the crystal should have an N-region enlarged by the nitrogen doping. This makes it possible to markedly increase the margins of the pulling rate F and the F/G value for obtaining N-region, and thus higher productivity and higher yield can be expected compared with the conventional practice. The wafer can be processed from the pulled crystal in a conventional manner.

In this case, the defect-free wafer can be produced from a single crystal that was grown with a concentration of doped nitrogen of $1 \times 10^{14}$ number/cm$^3$ or more and an F/G value (F: pulling rate, G: crystal solid-liquid interface temperature gradient) within a range of 0.14–0.22 mm$^2$/K·min at any point of crystal plane as such a condition that the entire plane of the crystal should become an N-region.

As for the pulling conditions, specifically, if the nitrogen concentration is $1 \times 10^{14}$ number/cm$^3$ or more, F/G can be controlled within the range of 0.14–0.22 mm$^2$/K·min as described above, and it can be easily controlled.

Further, in this case, the wafer is preferably produced from a single crystal that was grown with a doped nitrogen concentration of $5 \times 10^{14}$ number/cm$^3$ or more and an F/G value in the range of 0.12–0.24 mm$^2$/K·min at any point of crystal plane as such a condition that the entire plane of the crystal should become an N-region.

As described above, when the concentration of nitrogen to be doped is $5 \times 10^{14}$ number/cm$^3$ or more, the F/G value may be in the range of 0.12–0.24 mm$^2$/K·min. Therefore, the controllable range becomes wider, and the control is extremely easy.

In the method for producing a silicon single crystal wafer of the present invention, the silicon single crystal wafer produced by the aforementioned production method is preferably subjected to a heat treatment.

Because the silicon single crystal wafer produced by the production method of the present invention has an oxygen concentration of 8 ppma or less as described above, OSFs are not generated in it. However, if remained fine oxide precipitates are exposed on the surface, the dielectric breakdown voltage characteristics may be slightly degraded. Therefore, by subjecting the wafer to a heat treatment to dissolve the fine oxide precipitates, a wafer of high quality can more surely be obtained.

In this case, the heat treatment is desirably performed by using an apparatus for rapid heating and rapid cooling (RTA apparatus, Rapid Thermal Annealer).

This apparatus is an automatic continuous heat 13 treatment apparatus for single wafer processing, and it can perform heating and cooling before and after the heat treatment within several seconds to several hundreds of seconds. Therefore, it can effectively perform a heat treatment in a short period of time such as several seconds to several hundreds of seconds without subjecting a wafer to long thermal history, which is likely to be accompanied by disadvantages.

The fine oxide precipitates exposed on the surface can be easily extinguished by annealing using argon, hydrogen or the like in a short time RTA process at a high temperature. Furthermore, if it is desirable to more strongly impart the IG ability, the IG ability can also be increased by the RTA process in a nitrogen atmosphere or the like.

As explained above, according to the present invention, it becomes possible to effectively utilize the enlarged N-region irrespective of presence or absence of OSF region in the N-region by using an extremely low oxygen concentration, i.e., 5 ppma or less, in a pulled CZ crystal doped with nitrogen. Therefore, it becomes possible to produce defect-free silicon single crystal wafers containing no void type defects, OSFs nor dislocation clusters with extremely higher productivity, higher yield and lower cost compared with the conventional methods. In this case, if it is desired to impart the gettering ability, PBS or the like may be additionally performed.

Further, a defect-free wafer is obtained from a crystal not suffering from generation of OSFs and generation of dislocation loops originated from OSF nuclei by using an oxygen concentration of 5–8 ppma and utilizing the OSF region enlarged by the nitrogen doping. In addition, because it contains fine oxide precipitates, it can have IG ability. In this case, although the dielectric breakdown voltage characteristics may be degraded by the fine oxide precipitates, the dielectric breakdown voltage characteristics can be improved by subjecting the wafer to a heat treatment in an RTA apparatus or the like. Furthermore, if such a substantially defect-free wafer is used as an SOI layer, failures caused by penetration of void type defects through the SOI layer are not generated. Further, a larger diameter can be used since it is a CZ wafer, and moreover it can be obtained at a relatively low cost. Therefore, reduction of the production cost of high quality SOI wafers can be contemplated.

BEST MODE FOR CARRYING OUT THE INVENTION

Figure 1:
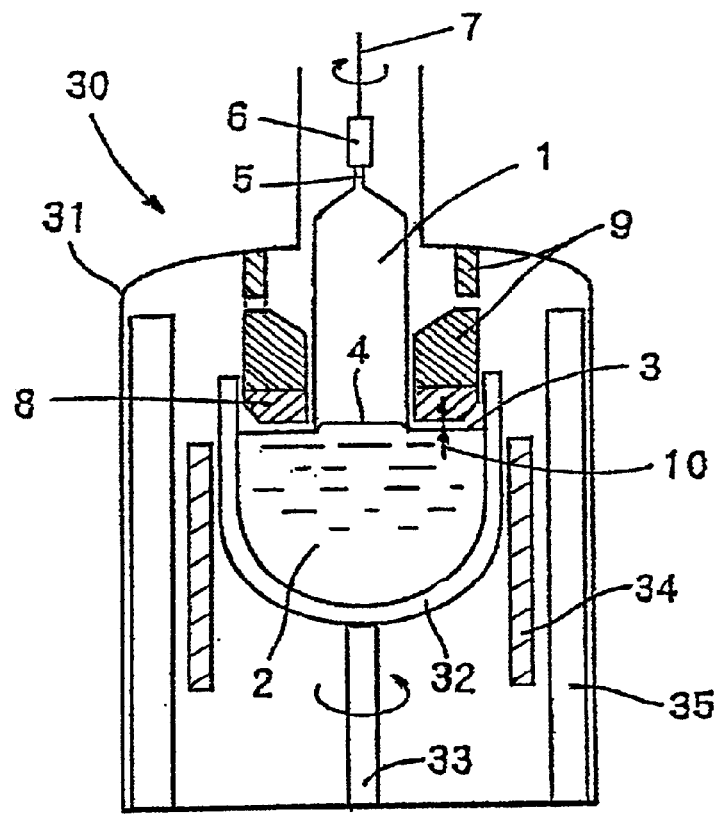
FIG. 1 is a schematic view showing a single crystal pulling apparatus based on the CZ method used for the present invention.

The present invention will be explained in detail hereinafter, but the present invention is not limited by this explanation. Before the explanation, technical terms used herein are defined beforehand.

1) FPD (Flow Pattern Defect)

When a wafer sliced from a grown silicon single crystal ingot is subjected to etching with a mixture of hydrofluoric acid and nitric acid to remove a surface damaged layer, and then surface etching with a mixture of $K_2Cr_2O_7$, hydrofluoric acid and water without agitation (Secco etching), pits and a ripple pattern are formed on the wafer surface. This ripple pattern is called FPD, and a higher FPD density on the wafer surface caused more frequent oxide dielectric breakdown voltage failure (see Japanese Patent Application Laid-open (KOKAI) No. 4-192345).

2) SEPD (Secco Etch Pit Defect)

When a wafer is subjected to the same Secco etching for FPD as mentioned above, pits accompanied by a flow pattern are called FPD, and those not accompanied by the flow pattern are called SEPD. Among those SEPDs, large SEPDs having a size of 10 μm or more (LSEPD) are considered to be originated from dislocation clusters, and electric current may leak through these dislocation clusters when dislocation cluster is present in devices, consequently, the function of a P-N junction is not effected.

3) LSTD (Laser Scattering Tomography Defect)

After a wafer is sliced from a grown silicon single crystal ingot, and subjected to etching with a mixture of hydrofluoric acid and nitric acid to remove a surface damaged layer, the wafer is cleaved. When the cleaved surface is irradiated with an infrared light, scattered lights caused by defects present in the wafer can be observed by detecting lights emitted from the wafer surface. The light-scattering substances detected in this observation have already been reported in academic societies and so forth, and considered to be oxygen precipitates (see J. J. A. P., Vol. 32, p3679, 1993). More recent study also reported that they are octahedral voids (holes).

4) COP (Crystal Originated Particle)

COP means defects which degrade oxide dielectric breakdown voltage at the center of wafer, and which is revealed as FPD after the Secco etching, but is revealed as COP after SC-1 cleaning (cleaning with a mixture of $NH_4OH:H_2O_2:H_2O=1:1:10$), which serves as a selective etching solution. Pits of this type have a diameter of 1 μm or less, and detected by the light scattering method.

5) L/D (Large Dislocation, also Called Interstitial Dislocation Loop)

Defects of this kind include LSEPD, LFPD and so forth, and they are considered to be originated from dislocation loops. Among SEPD, LSEPD refers to large ones having a size of 10 μm or more as described above. LFPD refers large ones having an end pit size of 10 μm or more among the aforementioned FPD, and they are also considered to be originated from dislocation loops.

As for defect-free crystals produced by the conventional methods with controlling F/G, both of the productivity and yield were low, because the pulling rate used for obtaining the N-region was low, and the margin of F/G was also small.

On the other hand, as previously proposed by the inventors of the present invention in Japanese Patent Application No. 11-022919, if F/G is controlled while nitrogen is doped, the N-region, i.e., a region containing no void type defects (FPD, COP etc.) and no dislocation clusters, which are observed in the I-rich region, is significantly enlarged. However, most of it consists of an N-region containing an OSF region, and enlargement degree of N-region containing no OSF region, which is practically usable as defect-free wafers, is relatively small. Therefore, the pulling rate for that portion is not so increased compared with the conventional methods. That is, improvement of production yield of defect-free crystals can be expected because the margin of F/G is expanded to some extent, but the productivity will not change so much.

Further, the OSF region obtained with nitrogen doping shows an OSF nucleus density higher by several times compared with an OSF region obtained without nitrogen doping, and dislocation loops generated due to such OSF nuclei are present and adversely affect devices. Therefore, it is difficult to be actually used.

Therefore, in order to improve the productivity of defect-free crystals and to lower the production cost, inventors of the present invention considered first how to effectively use the OSF region enlarged by the nitrogen doping. That is, this is because this region does not contain void type defects and dislocation clusters, which are observed in the I-rich region, and in addition, such a crystal can be grown at a relatively high speed with a wide margin of F/G.

As a result of investigations as for whether a crystal pulled so as to contain an N-region containing an OSF region can also be used as defect-free wafers, it was found that, if the oxygen concentration contained in a pulled crystal was an extremely low, OSFs could be inactivated (device characteristics were not affected). That is, if OSFs are inactivated, the enlarged N-region can be effectively used, and therefore it becomes possible to produce defect-free wafers with extremely higher productivity and higher yield compared with the conventional practice.

Therefore, attention was paid to the relationship between the OSF region enlarged by the nitrogen doping and the oxygen concentration, and detailed experiments and examinations were conducted.

As a result, when the oxygen concentration was high (18 ppma (Japan Electronic Industry Development Association (JEIDA) standard)) or higher, OSFs were generated in an OSF test performed at 1150° C. for 100 a minutes in a wet $O_2$ atmosphere. Further, while dislocation loops were observed at a high density after the Secco etching, the densities of OSFs and dislocation loops were reduced when the oxygen concentration became 10 ppma or less, and no OSFs and no dislocation loops were generated when it became 8 ppma or less. That is, it was found that, even though the OSF region enlarged by the nitrogen doping was used, OSFs could be inactivated by using an oxygen concentration of 8 ppma or less, and thus defect-free silicon single crystals not containing void type defects, dislocation clusters, OSFs, dislocation loops on OSFs and so forth could be produced with high productivity and high yield.

Then, the oxide dielectric breakdown voltage characteristics of these crystals were investigated. As a result, a lower oxygen concentration provided better dielectric breakdown voltage characteristics. It is considered that this was due to dependency on the size of oxide precipitates that could serve as OSF nuclei. That is, it is considered that the size of oxide precipitates became smaller with the decrease of oxygen concentration, and it became more unlikely that they affected the oxide dielectric breakdown voltage characteristics. Further, when the oxygen concentration became 5 ppma or less, the good chip yield as for the dielectric breakdown voltage characteristics (TZDB) reached 100%.

However, a wafer having an oxygen concentration of 5 ppma or less does not contain precipitates and substantially no gettering ability due to the low oxygen concentration. Therefore, when appropriate gettering ability (IG ability) is also required, the oxygen concentration should be selected to be within the range of 5–8 ppma.

In the actual pulling method, the generation of OSF region changes with change of nitrogen concentration. For example, when the nitrogen concentration is $1 \times 10^{14}$ number/cm$^3$ or more, if the crystal is pulled so that the F/G value should be within the range of 0.14–0.22 mm$^2$/K·min at any point of crystal plane and the oxygen concentration is controlled to be 8 ppma or less, the crystal would have a region that potentially has OSF nuclei (potential OSF region: region in which OSFs will be generated if the oxygen concentration exceeds 8 ppma) for the entire plane.

In this case, the oxygen concentration can be controlled by controlling crucible rotation rate, application of magnetic field, gas flow and so forth as conventionally practiced.

Further, when the nitrogen concentration becomes higher, the potential OSF region is further enlarged. For example, when the nitrogen is doped at a concentration of $5 \times 10^{14}$ number/cm$^3$ or more, a crystal a can be pulled so that the F/G value should be within the range of 0.12–0.24 mm$^2$/K·min at any point of crystal plane.

According to such a method, it becomes possible to grow a single crystal with a large margin and high speed. Then, by processing the crystal into wafers through slicing, chamfering, grinding, etching, mirror-surface polishing steps and so forth in a conventional manner, there can be produced defect-free silicon single crystal wafers that contain neither of voids, OSFs and dislocation clusters as well as dislocation loops on OSFs.

In order to further enhance the functions of wafer, the wafer may be subjected to an EG treatment such as PBS and BSD as for the main surface opposite to the other main surface on which devices are to be fabricated. In particular, when a low oxygen concentration of 5 ppma or less is used, the crystal is completely free from various defects, and hence it shows extremely good defect and electric characteristics. However, since it does not contain bulk defects too, it lacks the gettering ability. Therefore, when the gettering ability is required in the device production line, an EG treatment such as PBS and BSD may be performed to impart the gettering ability.

Further, when the oxygen concentration is 8–5 ppma, OSFs are not generated, but there remain fine precipitates. Therefore, such a wafer has higher gettering ability compared with the aforementioned wafer, but if the fine precipitates are exposed on the surface, the dielectric breakdown voltage characteristics may be slightly degraded. In such a case, the fine precipitates can be dissolved only for the surface by subjecting the wafer to a certain heat treatment. For example, the fine precipitates can be easily extinguished by annealing using argon, hydrogen, nitrogen or the like in an RTA process. In this case, since these precipitates are extremely small, they can be well extinguished even by a high temperature and short time process in an RTA apparatus.

The RTA process used herein is a process wherein a heat treatment is performed by using an RTA apparatus (Rapid Thermal Annealer, apparatus for rapid heating and rapid cooling). This apparatus is an automatic continuous heat treatment apparatus for single wafer processing, and it can perform heating and cooling before and after the heat treatment within several seconds to several hundreds of seconds. Therefore, it can effectively perform a heat treatment in a short period of time such as several seconds to several hundreds of seconds without subjecting a wafer to long thermal history, which is likely to be accompanied by disadvantages.

Furthermore, if it is desired to impart gettering effect more strongly, the gettering effect can be enhanced by the already well-known RTA process in a nitrogen atmosphere or the like as for any wafers.

In addition, if such a substantially defect-free silicon single crystal wafer is used as an SOI layer, there are not generated failures due to penetration of void type defects through the SOI layer. That is, in the production of SOI layer in which, for example, two of silicon wafers are bonded via an oxide film and the wafer of the side on which devices are to be fabricated is made into a thin film to form an SOI layer, if the silicon wafer of the present invention is used at least as the wafer that is to be the SOI layer among the wafers to be bonded, defects would not exist in the SOI layer after the formation of the thin film, and therefore it would have extremely good characteristics.

Moreover, because it is a CZ wafer, it can be produced with a larger diameter and can be obtained at a relatively low cost. Therefore, the reduction of production cost of high quality SOI wafers can be contemplated.

An exemplary structure of apparatus for pulling a single crystal by the CZ method used for the present invention will be explained hereafter by referring to FIG. 1. As shown in FIG. 1, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefor (not shown in the figure), seed chuck 6 for holding a silicon seed crystal 5, wire 7 for pulling the seed chuck 6, and winding mechanism (not shown in the figure) for rotating and winding the wire 7. The crucible 32 is composed of an inner quartz crucible for accommodating a silicon melt (molten metal) 2, and an outer graphite crucible. Further, a heat insulating material 35 surrounds the outside of the heater 34.

Further, in order to establish production conditions used for the production method of the present invention, an annular solid-liquid interface heat insulating material 8 is provided around the periphery of the solid-liquid interface 4 of the crystal 1, and an upper surrounding heat insulating material 9 is provided thereon. This solid-liquid interface heat insulating material 8 is provided so as to form a gap 10 of 3–5 cm between its lower end and the melt surface 3 of silicon melt 2. The upper surrounding heat insulating material 9 may not be used depending on the conditions. Further, a cylindrical cooling apparatus not shown in the figure may be provided for cooling the single crystal by blowing cooling gas or shielding the radiant heat.

As another method, the so-called MCZ method is recently often used, in which a non-illustrated magnet is additionally installed outside the pulling chamber 31 in the horizontal direction, and a horizontal or vertical magnetic field is applied on the silicon melt 2 so as to prevent convection of the melt and realize stable growth of a single crystal.

The method for pulling a nitrogen-doped single crystal by using the aforementioned apparatus 30 will be explained hereafter.

First, a silicon polycrystal raw material of high purity is melted in the crucible 32 by heating it to a temperature higher than the melting point (about 1420° C.). At this point, silicon wafers having nitride films, for example, are added in order to dope nitrogen. Then, a tip end of the seed crystal 5 is brought into contact with the surface of the melt 2, or immersed into the melt 2 at its approximate center portion by reeling out the wire 7. Subsequently, the crucible-holding shaft 33 is rotated in an optional direction, and at the same time the seed crystal 5 is pulled upwardly by winding up the wire 7 with rotating the wire to start the growing of single crystal. Thereafter, a single crystal ingot 1 approximately in a cylindrical shape can be obtained by suitably controlling the pulling rate and temperature.

In this case, according to the present invention, in order to control the temperature gradient in the crystal, as shown in FIG. 1, the gap 10 between the lower end of the solid-liquid interface heat insulating material 8 and the melt surface 3 of the silicon melt 2 is controlled, at the same time, the annular solid-liquid interface heat insulating material 8 is disposed in a region in which the temperature of the crystal near the melt surface is in a temperature range of, for example, 1420–1400° C., in the space surrounding a liquid portion of the single crystal ingot 1 above the melt surface in the pulling chamber 31, and the upper surrounding heat insulating material 9 is disposed thereon. Further, if required, the temperature can be controlled by providing an apparatus for cooling the crystal above the insulating material so that the crystal can be cooled by blowing a cooling gas to it from the above, and providing a collar for shielding the radiant heat at the lower part of a cylinder.

During the pulling, the crucible rotation number, crystal rotation number, introduced gas flow rate, atmospheric pressure, intensity and direction of applied magnetic field can be controlled so that the oxygen concentration in the crystal should become 8 ppma or less. For example, by decreasing the crucible rotation number, increasing the gas flow rate, lowering the pressure, or increasing the magnetic field intensity, the oxygen concentration can be lowered below a desired level.

Then, the obtained nitrogen-containing silicon single crystal ingot can be processed into the wafer of the present invention through, for example, slicing, chamfering, grinding, etching and mirror-surface polishing. Of course, the wafer processing method is not limited to these processes, and any of usually used processes can also be used.

Further, the obtained wafer may then be subjected to a heat treatment to dissolve and extinguish fine oxide precipitates remaining on the wafer surface. In the present invention, an apparatus capable of rapid heating and rapid cooling is used for this heat treatment. Examples of the RTA apparatus include apparatuses such as lamp heaters based on heat radiation. As an example of commercially available apparatuses, SHS-2800 produced by Steag can be mentioned. These apparatuses are not particularly complicated, and are not expensive either.

Figure 2:
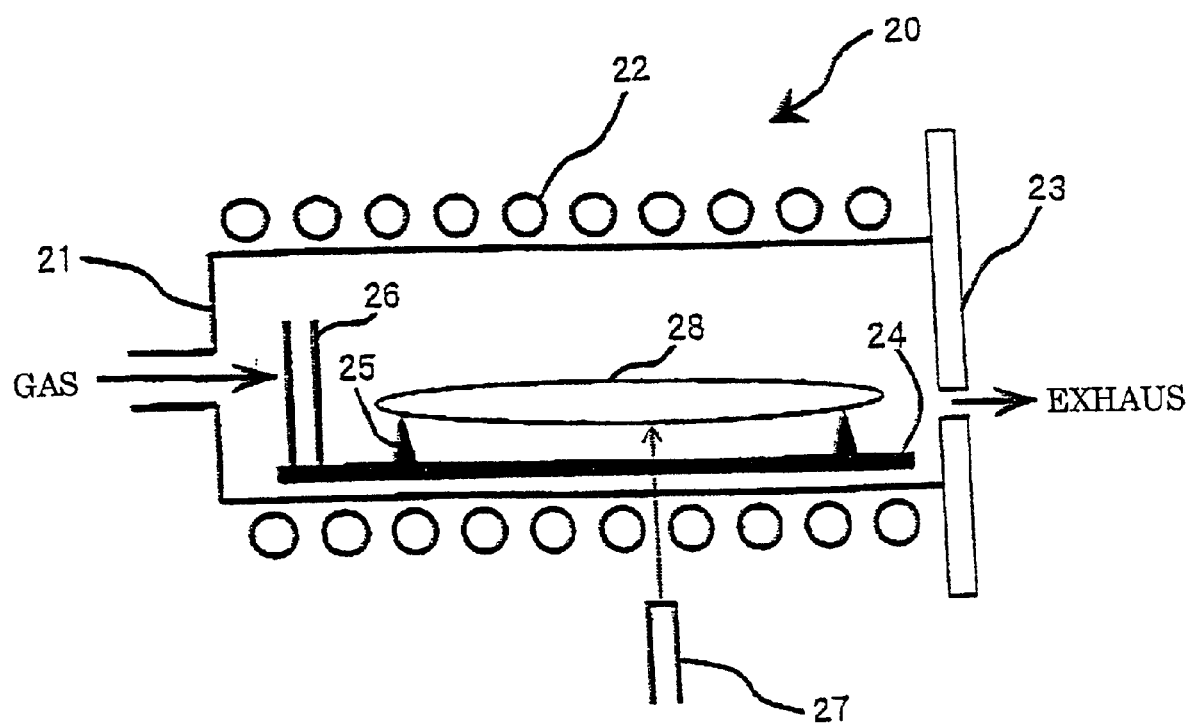
FIG. 2 is a schematic explanatory view of an exemplary rapid thermal annealer used for the present invention.

An example of the rapid thermal annealer (RTA apparatus) for silicon single crystal wafers used in the present invention will be explained hereafter. FIG. 2 is a schematic view of the RTA apparatus.

The heat treatment apparatus 20 shown in FIG. 2 has a chamber 21 consisting of quartz, and a wafer is heat-treated within this chamber 21. Heating is achieved by heating lamps 22, which are disposed under and over the chamber and at left and right of the chamber so that they should surround the chamber 21. Electric power supplied to these lamps can be independently controlled.

As for the gas supplying side, a non-illustrated hydrogen gas feed source, argon feed source and nitrogen gas feed source are connected, so that these gases can be mixed in an arbitrary ratio and supplied into the chamber 21.

An auto shutter 23 is provided at the gas exhausting side, and it shuts the inside of the chamber 21 off from the outer air. The auto shutter 23 has a wafer loading port not shown in the figure, which can be opened and closed by a gate valve. The auto shutter 23 is also provided with a gas exhausting outlet, so that the atmospheric pressure in the furnace can be controlled.

The wafer 28 is placed on a three-point supporting part 25 formed on a quartz tray 24. A buffer 26 made of quartz is provided at the gas inlet side of the tray 24, so that it can prevent the wafer 28 from being directly blown by the introduced gas flow.

Further, the chamber 21 is provided with a special window for temperature measurement, which is not shown in the figure, and the temperature of the wafer 28 can be measured by a pyrometer 27 installed in the outside of the chamber 21 through the special window.

By using the heat treatment apparatus 20 described above, the treatment for rapid heating and rapid cooling of a wafer is performed as follows.

First, the wafer 28 is loaded into the chamber 21 from the loading port and placed on the tray 24 by a wafer handling apparatus disposed at a position adjacent to the heat treatment apparatus 20 but not shown in the figure. Then, the auto shutter 23 is closed, and the inside of the chamber 21 is filled with a predetermined reducing atmosphere containing hydrogen.

Subsequently, electric power is supplied to the heating lamps 22 to heat the wafer 28 to a predetermined temperature, for example, 1100° C. to the melting point of silicon, in particular, 1300° C. or lower. In this operation, it takes, for example, about 20 seconds to attain the desired temperature. Then, the wafer 28 is maintained at the temperature for a predetermined period of time, and thus the wafer 28 can be subjected to a high temperature heat treatment.

When the predetermined time has passed and the high temperature heat treatment is finished, output of the lamps 22 is reduced to lower the temperature of the wafer 28. In the heat treatment method according to the present invention, the temperature decreasing rate from the maximum temperature in the heat treatment to 700° C. is adjusted to 20° C./sec or less. This method can be practiced by making only a slight modification to a conventional method, i.e., only by lowering the temperature decreasing rate to 20° C./sec or less by appropriately controlling the output of the lamps 22 with measurement of the temperature of the wafer 28 by the pyrometer 27, while the temperature decrease was conventionally performed at a temperature decreasing rate of 30° C./sec to 60° C./sec over a period of about 20–40 seconds. Therefore, the method of the present invention can be performed without making substantial modification to a conventionally used RTA apparatus. Finally, after the temperature decrease of the wafer is completed, the wafer is unloaded by the wafer handling apparatus to finish the heat treatment.

If it is desired to shorten the temperature decreasing time, the wafer can be rapidly cooled by, for example, turning off the output of the lamps 22 when the temperature of the wafer 28 measured by the pyrometer 27 becomes 700° C. or lower. Alternatively, the temperature decreasing time can also be shortened by unloading the wafer 28 by the wafer handling apparatus and transferred to a space at room temperature to increase the temperature decreasing rate in the range of 700° C. or lower.

The present invention will be explained hereafter with reference to the following specific examples of the present invention. However, the present invention is not limited by these.

EXAMPLE 1

Using a pulling apparatus 30 shown in FIG. 1, raw material polycrystal silicon was charged into a quartz crucible having a diameter of 18 inches, and a single crystal ingot of p-type as for conductivity type having a diameter of 6 inches and orientation of <100> was pulled. A horizontal magnetic field of 3000 Gausses was applied to the silicon melt to suppress the convection. The crystal was pulled with changing the pulling rate within the range of 0.49–0.77 mm/min.

Further, there was provided a space having a height of 4 cm between the melt surface and the lower end of annular solid-liquid interface heat insulating material, and the annular solid-liquid interface heat insulating material had a height of 10 cm. The height from the melt surface to the ceiling of the pulling chamber was adjusted to 30 cm by moving the crucible-holding shaft, and an upper surrounding heat insulating material was disposed.

Nitrogen was doped with adjustment of the amount of added wafers having nitride films, and the oxygen concentration was controlled to be 4 ppma (JEIDA). Further, the crystal was pulled so that the F/G value at the crystal center should be in the range of 0.14–0.22 $mm^2$/K·min.

A wafer was sliced from the obtained single crystal ingot at a position having a calculated nitrogen concentration of $2 \times 10^{14}$ number/$cm^3$, and subjected to mirror surface polishing to produce a mirror surface wafer of the silicon single crystal. Then, the wafer was measured for void type defects (FPD, LSPD, COP) and dislocation clusters. Further, the wafer was subjected to an oxidation heat treatment, and presence or absence of generation of an OSF ring was confirmed.

As a result, neither grown-in defects nor OSFs were observed for the entire length of the crystal.

Then, the wafer was evaluated for the oxide dielectric breakdown voltage characteristics. First, C-mode yield for TZDB was determined. Phosphorus-doped polysilicon electrodes (oxide film thickness: 25 nm, electrode area: 8 $mm^2$) were fabricated on the wafer surface. The yield was evaluated as good chip yield for a dielectric breakdown electric field of 8 Mv/cm or more evaluated with a current density in decision of 1 mA/$cm^2$.

Further, -mode yield for TDDB was also measured. A stress electric current of 0.01 nA/$cm^2$ was continuously applied between the aforementioned phosphorus-doped polysilicon electrodes. Those for which dielectric breakdown was observed at a charge amount of 25 C/$cm^2$ or more were considered good chips, and the good chip yield thereof was used for the evaluation of the -mode yield.

As a result of the measurements, high good chip yields were obtained, i.e., 100% for TZDB and 94% in average for TDDB. Thus, the silicon wafer of the present invention was excellent in oxide dielectric breakdown voltage characteristics, and if this wafer is used for device production, improvements of device characteristics and yield can be expected.

COMPARATIVE EXAMPLE 1

As a comparative example, a silicon single crystal ingot was pulled and a silicon wafer was prepared with the exactly same conditions as in Example 1, except that nitrogen was not doped and the crystal was pulled at a pulling rate of 0.42–0.84 mm/min. And grown-in defects were measured and presence or absence of OSFs was determined in the same manner as in the example.

As a result, grown-in defects and OSF ring were observed depending on the position of the single crystal ingot at which a wafer was sliced. This indicates that, when nitrogen is not doped, the N-region not containing OSFs is present in an extremely narrow range, and it is difficult to stably produce wafers having N-region for the entire plane.

EXAMPLE 2

A nitrogen-doped silicon single crystal ingot was pulled in the same manner as in Example 1, except that the wafers having nitrogen films added into the raw material were increased, and the crystal was pulled while the oxygen concentration was controlled to be 7 ppma (JEIDA) with an F/G value at the crystal center within the range of 0.12–0.24 $mm^2/K \cdot min$.

Then, a wafer was sliced from the obtained single crystal ingot at a position having a calculated nitrogen concentration of $6 \times 10^{14}$ number/$cm^3$, and subjected to heat treatments at 800° C. for 4 hours and at 1000° C. for 16 hours. Thereafter, bulk defect density of the wafer after the heat treatments was measured.

The bulk defect density was measured by using OPP (Optical Precipitate Profiler, produced by Biorad Laboratories).

The measurement results were in the range of $5 \times 10^8$ to $1 \times 10^9$ defects/$cm^3$, and thus it was found that the bulk defect density was not so low, in spite of the extremely low oxygen concentration. This indicates high gettering effect of this wafer.

COMPARATIVE EXAMPLE 2

As a comparative example, a silicon single crystal ingot was pulled with an oxygen concentration of 7 ppma (JEIDA) in the same manner as in Example 2, except that nitrogen was not doped. As in Example 2, a wafer was sliced from the obtained single crystal ingot, and subjected to heat treatments at 800° C. for 4 hours and at 1000° C. for 16 hours. Thereafter, bulk defect density of the wafer after the heat treatments was measured by using OPP as in Example 2.

The measurement results showed only low defect numbers, i.e., $1 \times 10^6$ to $1 \times 10^7$ defects/$cm^3$. These results are considered to be obtained because oxygen precipitation is not promoted when nitrogen is not doped.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for cases where silicon single crystals having a diameter of 6 inches were grown. However, the present invention is not limited to them, and can also be applied to silicon single crystals having a diameter of 8–16 inches or larger, if a crystal is pulled with nitrogen doping and low oxygen concentration so that the crystal should have an N-region for the entire plane.

Further, the CZ method used for the present invention of course include the so-called MCZ method, in which a magnetic field is applied to a melt during the growth of a nitrogen-doped silicon single crystal ingot by the CZ method.

What is claimed:

1. A silicon single crystal wafer grown by the Czochralski method, which is doped with nitrogen, and has an N-region for the entire plane and an interstitial oxygen concentration of 5–8 ppma.

2. A silicon single crystal wafer grown by the Czochralski method, which is doped with nitrogen, and has an interstitial oxygen concentration of 5–8 ppma, and in which at least void type defects and dislocation clusters are eliminated from the entire plane.

3. A silicon single crystal wafer, which is doped with nitrogen, has an N-region for the entire plane, and has an interstitial oxygen concentration of less than 5 ppma, and one main surface of the silicon single crystal wafer is subjected to an EG treatment.

4. A silicon single crystal wafer, which is doped with nitrogen, has an interstitial oxygen concentration of less than 5 ppma, in which at least void type defects and dislocation clusters are eliminated from the entire plane, and the main surface of the silicon single crystal wafer is subjected to an EG treatment.

5. The silicon single crystal wafer according to claim 1, wherein the concentration of the doped nitrogen is $1 \times 10^{14}$ number/$cm^3$ or more.

6. The silicon single crystal wafer according to claim 2, wherein the concentration of the doped nitrogen is $1 \times 10^{14}$ number/$cm^3$ or more.

7. The silicon single crystal wafer according to claim 1, wherein the concentration of the doped nitrogen is $5 \times 10^{14}$ number/$cm^3$ or more.

8. The silicon single crystal wafer according to claim 2, wherein the concentration of the doped nitrogen is $5 \times 10^{14}$ number/$cm^3$ or more.

9. The silicon single crystal wafer according to claim 1, wherein one main surface of the silicon single crystal wafer is subjected to an EG treatment.

10. The silicon single crystal wafer according to claim 2, wherein one main surface of the silicon single crystal wafer is subjected to an EG treatment.

11. An SOI wafer, wherein a silicon single crystal wafer according to claim 1 is used as an SOI layer.

12. An SOI wafer, wherein a silicon single crystal wafer according to claim 2 is used as an SOI layer.

13. A method for producing a silicon single crystal wafer, wherein the wafer is produced from a single crystal pulled under such conditions that the crystal should have an N-region for the entire plane and interstitial oxygen concentration should become 5–8 ppma when the crystal is grown by the Czochralski method with nitrogen doping.

14. The method for producing a silicon single crystal wafer according to claim 13, wherein the wafer is produced from a single crystal grown with a concentration of doped nitrogen of $1 \times 10^{14}$ number/$cm^3$ or more and an F/G value (F: pulling rate, G: crystal solid-liquid interface temperature gradient) in a range of 0.14–0.22 $mm^2/K \cdot min$ at any point of crystal plane as such a condition that the entire plane of the crystal should become an N-region.

15. The method for producing a silicon single crystal wafer according to claim 13, wherein the wafer is produced from a single crystal grown with a concentration of doped nitrogen of $5\times10^{14}$ number/cm$^3$ or more and an F/G value in a range of 0.12–0.24 mm$^2$/K·min at any point of crystal plane as such a condition that the entire plane of the crystal should become an N-region.

16. A method for producing a silicon single crystal wafer, wherein a silicon single crystal wafer produced by a production method according to claim 13 is subjected to a heat treatment.

17. A method for producing a silicon single crystal wafer, wherein a silicon single crystal wafer produced by a production method according to claim 14 is subjected to a heat treatment.

18. A method for producing a silicon single crystal wafer, wherein a silicon single crystal wafer produced by a production method according to claim 15 is subjected to a heat treatment.

19. The method for producing a silicon single crystal wafer according to claim 16, wherein the heat treatment is performed by using a rapid thermal annealer.

20. The method for producing a silicon single crystal wafer according to claim 16, wherein the heat treatment is performed by using a rapid thermal annealer.

21. The method for producing a silicon single crystal wafer according to claim 18, wherein the heat treatment is performed by using a rapid thermal annealer.

* * * * *